INVENTOR
ALBERT BURGERT

INVENTOR
ALBERT BURGERT

United States Patent Office 3,543,174

Patented Nov. 24, 1970

3,543,174

VARIABLE GAIN TRANSISTOR AMPLIFIER

Albert Burgert, Arcueil, France, assignor to Compagnie Generale d'Electricite, Paris, France Filed July 30, 1965, Ser. No. 474,891

Claims priority, application France, July 31, 1964, 983,913

Int. Cl. H03g 3/30

U.S. Cl. 330—29 4 Claims

ABSTRACT OF THE DISCLOSURE

A variable gain two-stage transistor amplifier having a constant input impedance including a first common emitter amplifier stage connected to a second common base amplifier stage by way of a first diode and a non-linear current by-pass means including a second diode and a bias voltage source for diverting a selected portion of the current output of the first stage wherein to provide control either said bias voltage source is variable or said bias voltage source is fixed and the output of said amplifier is detected and fed back to the base of said second amplifier stage.

Figure 1:
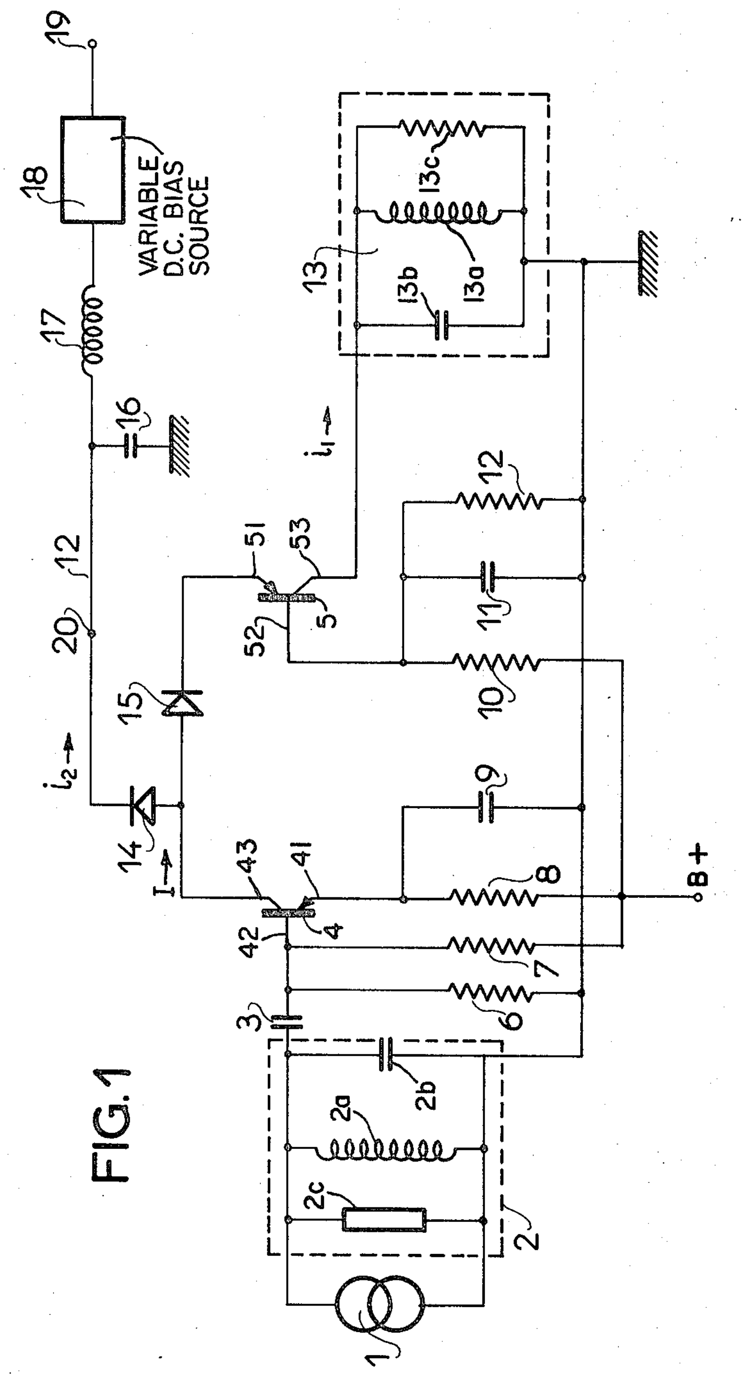

The present invention relates to a transistor amplifier circuit allowing adjustment over a wide range of amplification performance, together with a very small influence of the variation of the transistor parameters upon the characteristics of the input and output circuits.

The adjustment of the gain of transistor amplifiers is a delicate operation for which there does not exist a solution as simple and satisfactory as for vacuum-tube amplifiers. In the case of vacuum tube amplifiers, variable-mu tubes may be used for varying the amplification of one stage in a range which may exceed 30 decibels by varying the signal grid bias. As is well known, variation of the parameters of a multi-mu tube under such conditions does not affect appreciably the characteristics of the circuits connected to the tube.

If, using similar means, an attempt is made to modify the operating point of a transistor in order to obtain a gain variation, the parameters of the transistor (input and output impedances, passband, etc. . . .) will, as is known, vary considerably and influence notably the circuits to which it is connected.

The processes generally used for varying the gain of a transistor amplifier at D.C. voltage, more particularly for automatic gain control, are the following:

(1) Use of a diode or of a second transistor as a variable voltage divider arranged at the input or at the output of the transistor amplifier stage.
(2) Combination of a transistor with a damping diode.
(3) Use of special transistors with non-linear characteristics.
(4) Use of a variable-attenuation line, the elements of which (diodes, transistors) have an impedance varying as a function of an applied control current the amplifying transistors thereby operating under unchanged conditions.

As is known, there exists variable-gain transistor circuits, in which a diode connected at the stage input diverts a variable part of the emitter-to-base current, and which provide a gain variation which may exceed 20 decibles, the input impedance being nearly constant. However, the present invention makes it possible to obtain better results than has heretofore been achieved by the prior art.

According to the present invention, in a two-transistor amplifier stage, which may be compared to the "cascade"

arrangement for tube-amplifiers, comprising a common-emitter input transistor, the collector of which is connected to the emitter of a common-base second transistor, a first diode is inserted in the collector-emitter connection, and a second diode is connected between the collector of the first stage and a variable bias source, which may possibly be generated from the amplifier output A.C. voltage.

The first transistor operates with a constant current and part of the current from the first transistor, which flows through the second transistor, is diverted into the second above-mentioned diode as a function of the bias applied thereto. This diverted part of the current may thus vary between 0 and 100% of the output of the first transistor stage resulting in a large variation of the overall amplifier gain.

Figure 2:
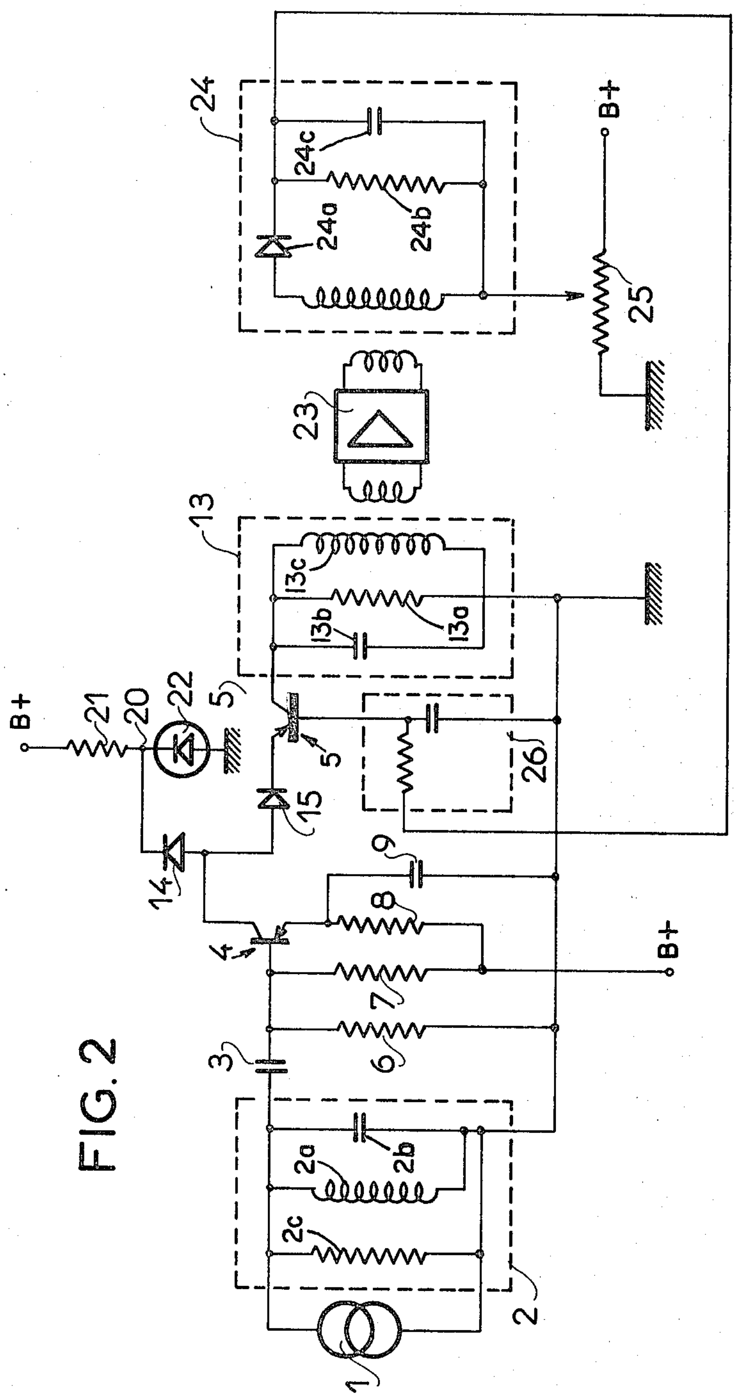

These and other features of the invention will be apparent from the following description taken in connection with the accompanying drawings, in which:

FIGS. 1 and 2 show two exemplary embodiments of the present invention.

In FIG. 1, a supply source 1 energizes an input circuit 2, comprising for instance a tuned anti-resonant circuit consisting of an inductor 2*a* and a capacitor 2*b*, shunted by a resistor 2*c*, which feeds, through a coupling capacitor 3, a common-emitter transistor 4, the base 42 of which is biased, from a supply source B, through the resistors 6 and 7, and the emitter 41 of which is connected to ground through the resistance-capacitance network 8, 9. The collector 43 of the transistor 4 is connected, through a diode 15, to the emiter 51 of a common base transistor 5. The base 52 of this transistor is biased by means of the resistors 10, 12 and decoupled by means of the capacitor 11. The collector 53 of the transistor 5 is loaded by an output circuit 13, which is, for instance, a tuned anti-resonant circuit including an inductor 13*a* and a capacitor 13*b* shunted by a resistor 13*c*.

A second diode 14 is connected between the collector 43 of the transistor 4 and a variable D.C. bias source 18 (for instance an automatic gain control amplifier fed by its terminal 19) through a blocking inductance 17, a capacitor 16 being used for decoupling.

It is seen that the collector 43 of the transistor 4 discharges into the input impedance of the grounded base transistor 5; as is known, such an impedance is extremely small, of the order of a few tenths of an ohm. The transistor 4 is thus practically operating under short-circuit conditions.

In addition, it is a well-known fact that the internal impedance of a common-base transistor is extremely high; as a result, the output circuit 13 virtually constitutes a short-circuit for the transistor 5.

The values of the voltages and currents at the various points of the circuit will be given hereafter for two extreme cases (a) and (b) $V_{42}$, etc., shall be the D.C. voltage applied to the base electrode 42, etc. Point 20 is the point common to the diode 14 and the inductance 17. It is assumed that the voltage of the supply sources B for these exemplary cases is 24 volts. The current delivered by the collector 53 has the value $i_1$, the current diverted by the diode 14 has the value $i_2$.

| | V42 | V41 | V43 | V20 | V51 | V52 | $i_1$ | $i_2$ |
|---|---|---|---|---|---|---|---|---|
| a) | +12 | +12.3 | +6.8 | +6.9 | +6.3 | +6 | I | 0 |
| b) | +12 | +12.3 | +5.8 | +5.3 | +5.9 | +6 | 0 | I |

For the case (a), the current delivered by the collector 53 has a maximum value I, which corresponds to the maximum amplification operation, since diode 14 is back biased to prevent diverted current flow therethrough.

For the case (b), the whole of the current I is diverted by the diode 14. The transistor 5 is blocked due to the relative voltages V51 and V52, the current through it is zero, and on principle, its gain is also zero. In addition, the diode 15 gets blocked due to the relative voltages V42 and V51 and serves even more to prevent the A.C. current from reaching the transistor 5 by keeping constant the load of the transistor 4.

Practically, the circuit according to the invention enables gain variations up to 60 decibels.

The variations affecting the transistors have no influence on the input and output circuits; this is so because the input transistor operates with constant current and under consant load and is not subject to variations. As for the output transistor, its variations do not affect the output circuit since it operates practically under short-circuit conditions.

In FIG. 2, the reference numerals 1 to 9, 13 to 15 and 20 denote the same elements as are shown in FIG. 1. However, in this embodiment the bias at point 20 is unvarying due to the use of a resistor 21 and of a Zener-effect diode 22. Element 23 represents one or several additional amplifier stages possibly added to the stage under consideration. A detection circuit 24 including a rectifier 24*a* and resistor-capacitor combination 24*b*–24*c* operates from the amplifier output signal, and provides a voltage for automatic gain control, which is applied from rectifier 24*a* to the base of the transistor 5 through a time-constant R-C circuit 26. The circuit 24 is also connected to the cursor of a potentiometer 25 which is in turn connected to a D.C. supply source B.

When the positive voltage on the base of transistor 5 rises, the current through this transistor decreases, while the diode 15 gets reverse-biased. The same result as in FIG. 1 is obtained, but, in the case of FIG. 2, the transistor 5 acts simultaneously as a variable gain A.C. amplifier, and as an automatic gain control voltage amplifier.

By adjusting the cursor of the potentiometer 25, it is possible to adjust a threshold point beyond which the output level remains approximately constant in the case of increasing input signals, while for lower input signals, the output level varies as a function of the input signal.

It is obvious that the numerical values mentioned above are illustrative only and that the circuits may be given other configurations without departing from the spirit and scope of the invention.

What is claimed is:

1. A variable-gain two-stage transistor amplifier comprising
   - a first common emitter transistor stage including a first transistor having base, emitter and collector electrodes,
   - a second common base transistor stage including a second transistor having base, emitter and collector electrodes,
   - network means interconnecting the collector of said first transistor and the emitter of said second transistor including a series non-linear conductor and
   - a shunt non-linear conductor connected between the collector of said first transistor and a bias supply source,
   - output means connected to the collector of said second transistor,
   - at least one additional amplifier stage coupled to said output means,
   - detector means for detecting the level of output of said additional amplifier stage, and
   - means for applying the output of said detector means to said second common base transistor stage for effecting automatic gain control,
   - said detector means including a rectifier coupled to the output of said additional amplifier stage and connected to the base of said second transistor, said bias supply source being constant.

2. A variable-gain two-stage transistor amplifier comprising

- a first common emitter transistor stage including a first transistor having base, emitter and collector electrodes,
   - a second common base transistor stage including a second transistor having base, emitter and collector electrodes,
   - network means interconnecting the collector of said first transistor and the emitter of said transistor including a series non-linear conductor, and
   - a shunt non-linear conductor connected between the collector of said first transistor and a bias supply source,
   - output means connected to the collector of said second transistor,
   - at least one additional amplifier stage coupled to said output means,
   - detector means for detecting the level of output of said additional amplifier stage, and
   - means for applying the output of said detector means to said second common base transistor stage for effecting automatic gain control,
   - said bias supply source being constant.

3. A variable gain two-stage transistor amplifier comprising
   - a first common emitter transistor stage including a first transistor having base, emitter and collector electrodes,
   - a second common base transistor stage including a second transistor having base, emitter and collector electrodes,
   - first diode means interconnecting the collector of said first transistor and the emitter of said second transistor and
   - non-linear current by-pass means connected to the collector of said first transistor for diverting a selected portion of the current output of said first common emitter transistor stage in response to selected control thereof,
   - said non-linear current by-pass means including second diode means and voltage source means for biasing said diode means,
   - output means connected to the collector of said second transistor,
   - at least one additional amplifier stage coupled to said output means,
   - detector means for detecting the level of output of said additional amplifier stage, and
   - means for applying the output of said detector means to said second common base transistor stage for effecting automatic gain control,
   - said detector means including a rectifier coupled to the output of said additional amplifier stage and connected to the base of said second transistor, said bias supply source being constant.

4. A variable gain two-stage transistor amplfier comprising
   - a first common emitter transistor stage including a first transistor having base, emitter and collector electrodes,
   - a second common base transistor stage including a second transistor having base, emitter and collector electrodes,
   - first diode means interconnecting the collector of said first transistor and the emitter of said second transistor, and
   - non-linear current by-pass means connected to the collector of said first transistor for diverting a selected portion of the current output of said first common emitter transistor sage in response to selected control thereof,
   - said non-linear current by-pass means including second diode means and voltage source means for biasing said diode means,
   - said voltage source means being variable,
   - said non-linear current by-pass means further including a series inductance and a shunt capacitor interconnecting said second diode means and said voltage source means, said variable voltage source consisting of an automatic gain control amplifier.

References Cited

UNITED STATES PATENTS

| | | | |
|---|---|---|---|
| 3,069,552 | 12/1962 | Thompson | 330—183 X |
| 2,849,626 | 8/1958 | Klapp | 330—24 X |
| 3,051,904 | 8/1962 | Waring | 330—29 X |
| 3,305,729 | 2/1967 | Stein | 330—24 X |
| 3,327,238 | 6/1967 | Harwood | 330—185 X |
| 3,344,355 | 9/1967 | Massman | 330—133 X |

FOREIGN PATENTS

| | | |
|---|---|---|
| 1,138,430 | 10/1962 | Germany. |

ROY LAKE, Primary Examiner

L. J. DAHL, Assistant Examiner